(12) United States Patent
Dai

(10) Patent No.: US 8,592,693 B2
(45) Date of Patent: Nov. 26, 2013

(54) ELECTRONIC DEVICE HOUSING

(75) Inventor: Bin Dai, ShenZhen (CN)

(73) Assignees: Fu Tai Hua Industry (Shenzhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 225 days.

(21) Appl. No.: 12/966,108

(22) Filed: Dec. 13, 2010

(65) Prior Publication Data

US 2012/0031667 A1    Feb. 9, 2012

(30) Foreign Application Priority Data

Aug. 4, 2010    (CN) .......................... 2010 1 0245080

(51) Int. Cl.
*H01R 13/502*    (2006.01)
*H05K 5/00*    (2006.01)
*H04M 1/00*    (2006.01)

(52) U.S. Cl.
USPC . 174/562; 174/563; 361/679.02; 361/679.04; 361/679.27; 361/679.3; 455/575.1

(58) Field of Classification Search
USPC ............ 361/679.01–679.09, 679.21–679.29, 361/679.3, 679.5, 679.51–679.59; 174/250–256, 559–564
See application file for complete search history.

(56) References Cited

U.S. PATENT DOCUMENTS

2010/0061040 A1*    3/2010   Dabov et al. ............. 361/679.01

FOREIGN PATENT DOCUMENTS

CN    2509789 Y    9/2002
TW    476908    2/2002

* cited by examiner

*Primary Examiner* — Robert J Hoffberg
*Assistant Examiner* — Jerry Wu
(74) *Attorney, Agent, or Firm* — Altis & Wispro Law Group, Inc.

(57) ABSTRACT

An electronic device housing includes a first housing, a second housing, a plurality of frames, and a plurality of fixing members. The first housing includes a bottom plate and a side plate extending from an edge of the bottom plate. The side plate is welded to the second housing. The frames are welded to the first housing. The fixing members fix the second housing to the frames.

4 Claims, 6 Drawing Sheets

ELECTRONIC DEVICE HOUSING

CROSS-REFERENCE TO RELATED APPLICATIONS

This application is related to two co-pending U.S. patent applications, which are: application Ser. No. 12/964,915, with Ser. No. 12/965,852, and all entitled "ELECTRONIC DEVICE HOUSING." Such applications have the same assignee as the instant application and are concurrently filed herewith. The disclosure of the above-identified applications is incorporated herein by reference.

BACKGROUND

1. Technical Field

The present disclosure relates generally to electronic device housings and, more particularly, to an electronic device housing formed by welding.

2. Description of Related Art

Referring to FIGS. 5 and 6, an electronic device housing 10 includes a bottom housing 11 and a top cover 12. The periphery of the top cover 12 is welded to the bottom housing 11. The top cover 12 and the bottom housing 11 are held together by a clamping member (not shown) during welding.

However, the top cover 12 easily deviates from the clamped welding position because the top cover 12 is smooth and can drift during welding. As a result, the electronic device housing 10 can present a poor appearance after welding. In addition, the top cover 12 is only welded to the bottom housing 11 along the periphery thereof, such that mechanical strength of the electronic device housing 10 is relatively low.

Therefore, there is room for improvement within the art.

BRIEF DESCRIPTION OF THE DRAWINGS

The components in the drawings are not necessarily drawn to scale, the emphasis instead placed upon clearly illustrating the principles of the present disclosure. Moreover, in the drawings, like reference numerals designate corresponding parts throughout the several views.

DETAILED DESCRIPTION

Figure 1:
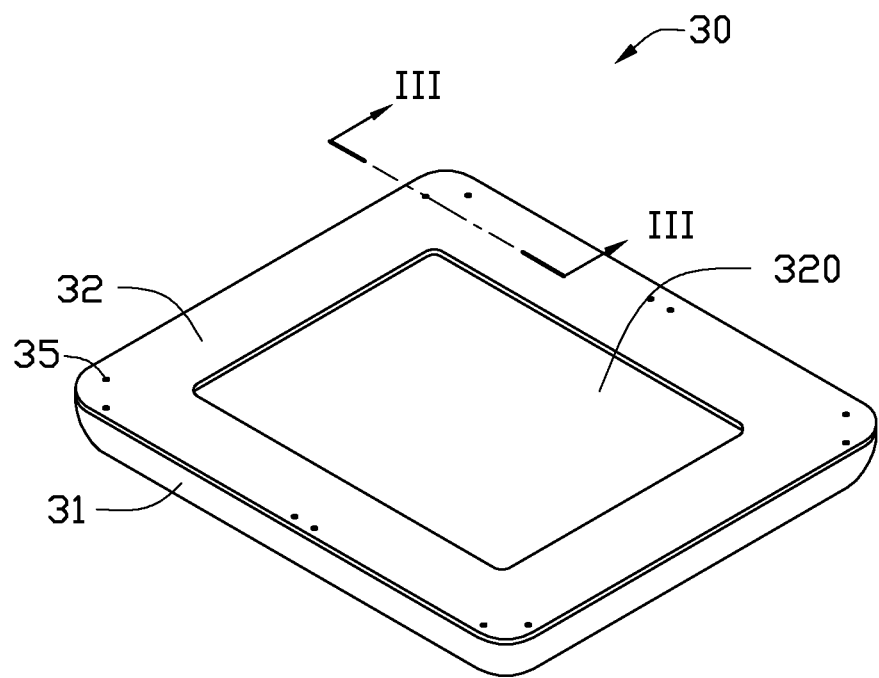
FIG. 1 is an isometric view of a first embodiment of an electronic device housing.
Figure 2:
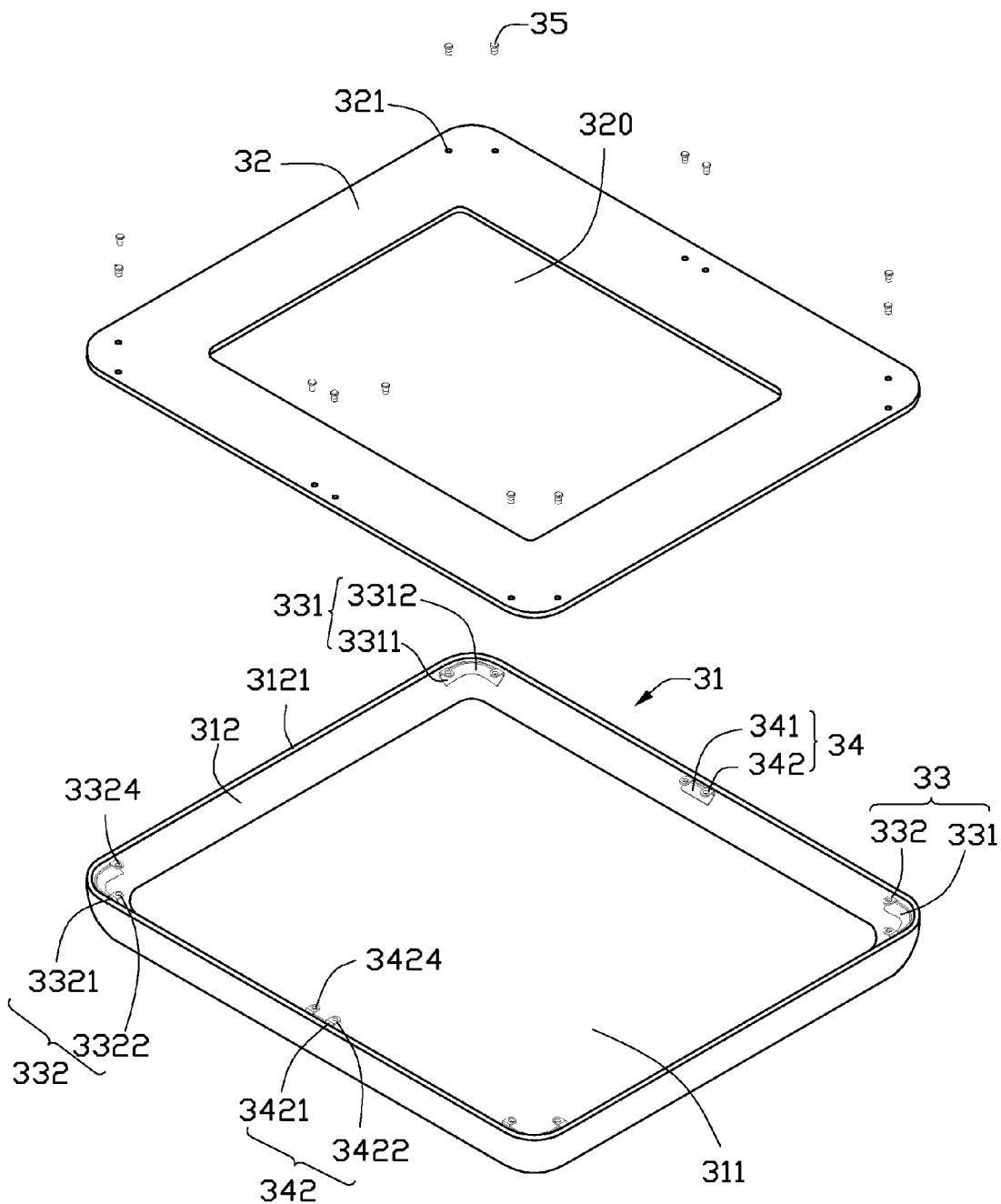
FIG. 2 an exploded, isometric view of the electronic device housing of FIG. 1.
Figure 3:
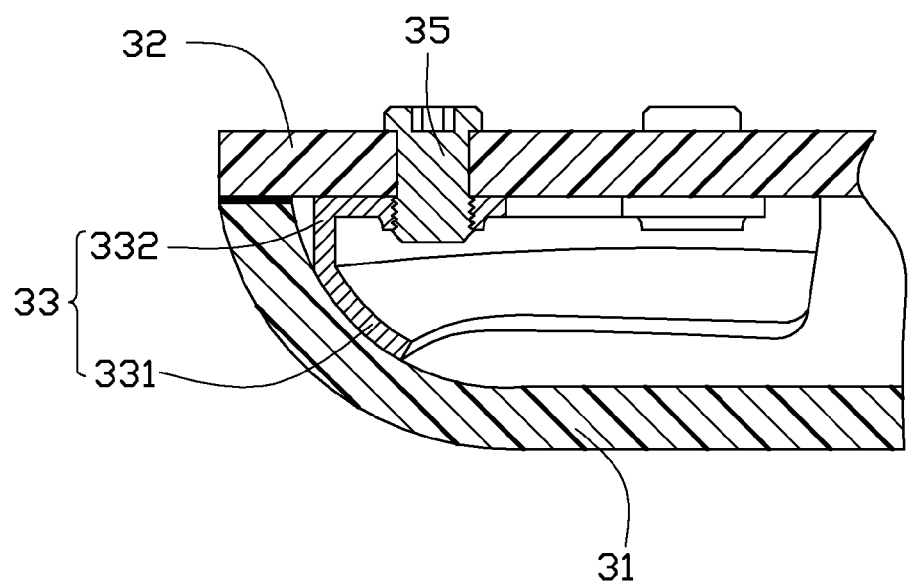
FIG. 3 is a partial cross-section of the electronic device housing of FIG. 1, taken along the line III-III.

Referring to FIGS. 1 through 3, a first embodiment of an electronic device housing 30 includes a first housing 31, a second housing 32, a first frame 33, a second frame 34, and a plurality of fixing members 35. The first frame 33 and the second frame 34 are welded to the first housing 31. The fixing members 35 connect the second housing 32 to the first frame 33 and the second frame 34. In the illustrated embodiment, the first housing 31 is a bottom housing, and the second housing 32 is a top cover. In the illustrated embodiment, the electronic device housing 30 includes four first frames 33 and two second frames 34.

The first housing 31 includes a substantially rectangular bottom plate 311 and a curved side plate 312 extending from a periphery of the bottom plate 311. A welding surface 3121 is formed at the top end of the side plate 312.

The second housing 32 is substantially rectangular, and defines an assembly groove 320 in a center to receive a display panel or other components (not shown). The second housing 32 further defines a plurality of through holes 321 in edges of the second housing 32. The periphery of the second housing 32 is attached to the welding surface 3121 of the first housing 31.

The first frames 33 are respectively positioned at four corners of the first housing 31. Each first frame 33 includes a welding portion 331 and two fixing portions 332 extending from two ends of the welding portion 331. The welding portion 331 includes a first welding section 3311 and a second welding section 3312 substantially perpendicular to the first welding section 3311. Each fixing portion 332 includes a support piece 3321 and a connecting piece 3322 extending from an end of the support piece 3321. The connecting piece 3322 defines a threaded hole 3324. In the illustrated embodiment, the first welding section 3311 and the second welding section 3312 are curved. The support piece 3321 and the connecting piece 3322 are substantially rectangular.

The second frames 34 are respectively positioned on opposite side plates 312 of the first housing 31. Each second frame 34 includes a welding portion 341 and two fixing portions 342 extending from an end of the welding portion 341. Each fixing portion 342 includes a support piece 3421 and a connecting piece 3422 extending from an end of the support piece 3421. The connecting piece 3422 defines a threaded hole 3424. In the illustrated embodiment, the welding portions 341 are curved pieces. The support piece 3421 and the connecting piece 3422 are substantially rectangular.

The fixing members 35 are fasteners in this embodiment. Each fixing member 35 extends through the through hole 321 of the second housing 32, and is received in the threaded hole 3324 of the first frame 33 or the threaded hole 3424 of the second frame 34, thus the second housing 32 is fixed on the first frames 33 and the second frames 34.

In welding the electronic device housing 30, the welding portions 331 of the first frames 33 and the welding portions 341 of the second frames 34 are welded to the first housing 31, and the second housing 32 is fixed to the first frames 33 and the second frames 34. The first housing 31 and the second housing 32 are clamped by a clamping member (not shown), and together to be welded by a welding device (not shown).

Because the first housing 31 and the second housing 32 are fixed together via the first frames 33, the second frames 34, and the fixing members 35, the first housing 31 cannot slide relative to the second housing 32, that is, the first housing 31 and the second housing 32 will not deviate from the predetermined position. Therefore, the first housing 31 and the second housing 32 can be welded accurately and the electronic device housing 30 will have a good appearance. In addition, the first housing 31 not only connects to the second housing 32 by welding, but also connects to the second housing 32 via the first frames 33, the second frames 34, and the fixing members 35, such that the connecting strength of the first housing 31 and the second housing 32 is increased.

It should be appreciated that the first housing 31 can be the top cover, and the second housing can be the bottom housing welded to the top cover. The welding portions 331, 341 may be other shapes, such as rectangular flat pieces if the side plate 312 is flat.

Figure 4:
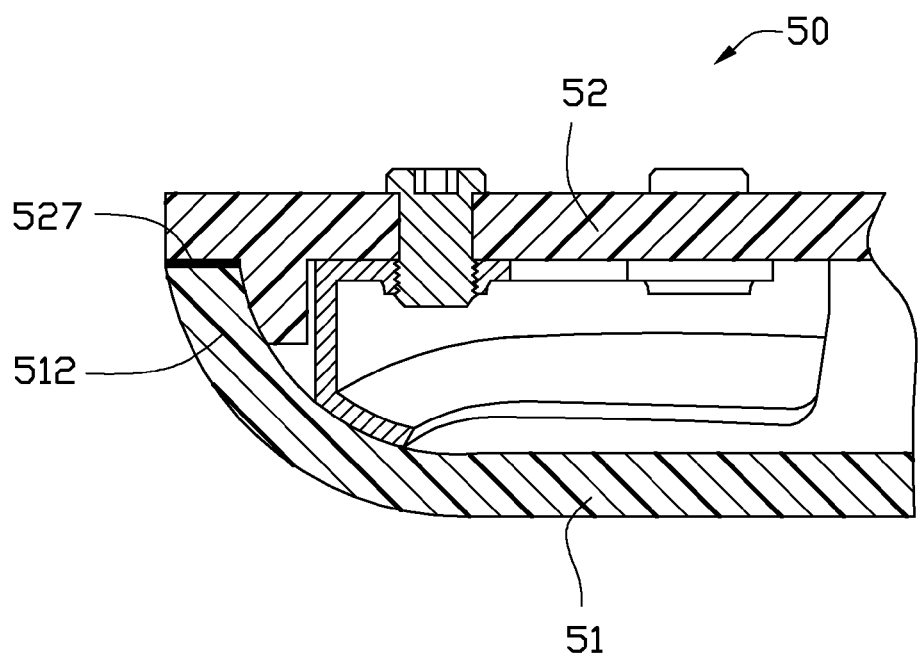
FIG. 4 is a partial cross-section of a second embodiment of an electronic device housing.
Figure 5:
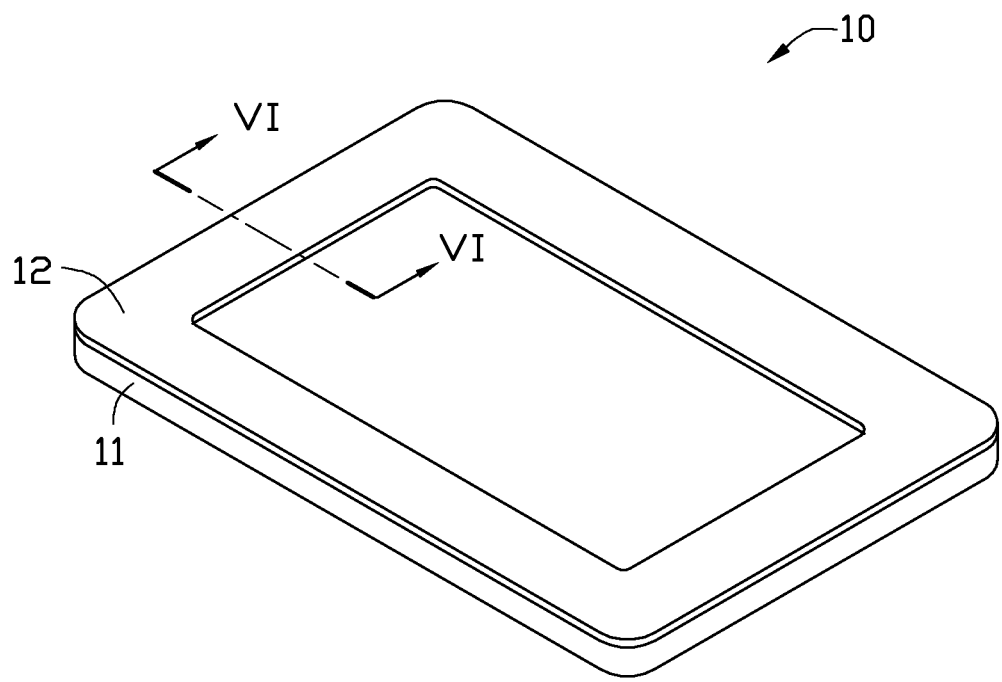
FIG. 5 is an isometric view of a commonly used electronic device housing.
Figure 6:
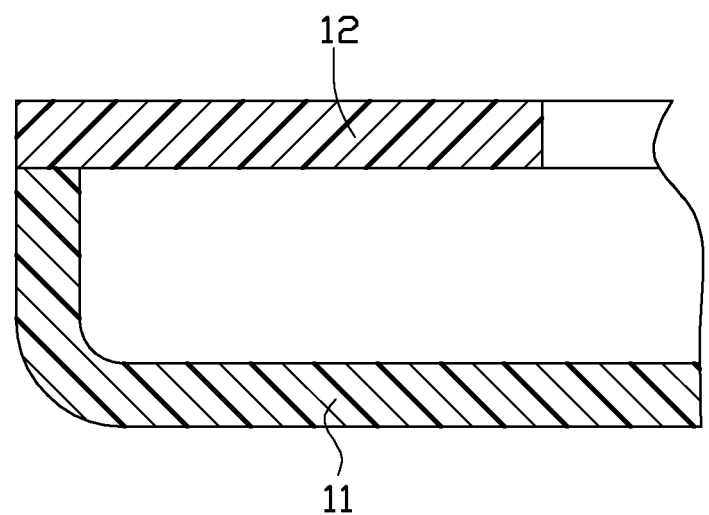
FIG. 6 is a partial cross-section of the electronic device housing of FIG. 5, taken along line VI-VI.

Referring to FIG. 4, a second embodiment of an electronic device housing 50 differs from the electronic device housing 30 only in that the second housing 52 defines a receiving groove 527 in an edge for receiving the side plate 512 of the first housing 51. The side plate 512 is welded to the inner surface in the receiving groove 527. The electronic device housing 50 has a relatively high connecting strength because the second housing 52 defines the receiving groove 527 for positioning the first housing 51.

It is believed that the present embodiments and their advantages will be understood from the foregoing description, and it will be apparent that various changes may be made thereto without departing from the spirit and scope of the disclosure or sacrificing all of its material advantages.

What is claimed is:

1. An electronic device housing, comprising:
   a first housing comprising a bottom plate and a side plate extending from a periphery of the bottom plate, a welding surface formed at a top end of the side plate;
   a second housing welded to the welding surface of the first housing;
   four frames welded to four corners of the side plate of the first housing, each of the four frames comprising a welding portion and two fixing portions extending from two ends of the welding portion, the welding portion comprising a first welding section and a second welding section substantially perpendicular to the first welding section, the first welding portion and the second welding portion welded to the corresponding one of the four corners of the side plate, each of the fixing portion comprising a support piece connected to the welding portion and a connecting piece extending from an end of the support piece; and
   at least one fixing member fixing the second housing to the connecting piece of at least one frame of the four frames.

2. The electronic device housing of claim 1, wherein the at least one fixing member is at least one fastener.

3. The electronic device housing of claim 1, wherein the side plate is curved.

4. The electronic device housing of claim 1, wherein the first welding section and the second welding section are curved.

* * * * *